United States Patent
Lu et al.

(10) Patent No.: US 11,024,688 B2
(45) Date of Patent: Jun. 1, 2021

(54) PIXEL STRUCTURE, DISPLAY PANEL AND DRIVING METHOD OF PIXEL STRUCTURE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Pengcheng Lu, Beijing (CN); Xue Dong, Beijing (CN); Xiaochuan Chen, Beijing (CN); Wenqing Zhao, Beijing (CN); Lei Wang, Beijing (CN); Ming Yang, Beijing (CN); Qian Wang, Beijing (CN); Rui Xu, Beijing (CN); Jian Gao, Beijing (CN); Xiaochen Niu, Beijing (CN); Haisheng Wang, Beijing (CN); Shengji Yang, Beijing (CN); Changfeng Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/579,936

(22) Filed: Sep. 24, 2019

(65) Prior Publication Data
US 2020/0020750 A1    Jan. 16, 2020

Related U.S. Application Data

(63) Continuation of application No. 15/560,572, filed as application No. PCT/CN2017/073562 on Feb. 15, 2017, now Pat. No. 10,468,471.

(30) Foreign Application Priority Data

May 18, 2016    (CN) .................. 201610330686.X

(51) Int. Cl.
*H01L 27/32*    (2006.01)
*G09G 3/20*    (2006.01)
(Continued)

(52) U.S. Cl.
CPC ............. *H01L 27/326* (2013.01); *G09G 3/20* (2013.01); *G09G 3/2074* (2013.01);
(Continued)

(58) Field of Classification Search
CPC ..... H01L 27/326; H01L 27/3276; G09G 3/20; G09G 3/2074; G09G 3/3225; G09G 3/3648; G09G 2300/0452; G06F 2201/52
See application file for complete search history.

(56) References Cited

U.S. PATENT DOCUMENTS

| | | | |
|---|---|---|---|
| 6,897,876 | B2 | 5/2005 | Murdoch |
| 8,237,633 | B2 | 8/2012 | Miller |

(Continued)

FOREIGN PATENT DOCUMENTS

| | | |
|---|---|---|
| CN | 103576366 | 2/2014 |
| CN | 103886808 | 6/2014 |

(Continued)

OTHER PUBLICATIONS

First Office action from Chinese Application No. 201610330686.X dated Apr. 18, 2018.
(Continued)

*Primary Examiner* — Peter D McLoone
(74) *Attorney, Agent, or Firm* — Calfee, Halter & Griswold LLP

(57) ABSTRACT

A pixel structure is disclosed. The pixel structure includes a plurality of sub-pixel groups arranged in an array, wherein each sub-pixel group is constituted by 6 sub-pixels of different colors arranged in two rows and three columns respectively. In each row of the sub-pixels, a square pixel
(Continued)

unit is constituted by at most two adjacent sub-pixels. The present application further discloses a display panel and a driving method of said pixel structure.

15 Claims, 6 Drawing Sheets

(51) Int. Cl.
  *G09G 3/3225* (2016.01)
  *G09G 3/36* (2006.01)
(52) U.S. Cl.
  CPC ......... *G09G 3/3225* (2013.01); *G09G 3/3648* (2013.01); *H01L 27/3276* (2013.01); *G02F 2201/52* (2013.01); *G09G 2300/0452* (2013.01)

(56) References Cited

U.S. PATENT DOCUMENTS

| | | | |
|---|---|---|---|
| 8,466,856 B2 | 6/2013 | Hamer | |
| 9,347,647 B2 | 5/2016 | Hamer | |
| 9,478,160 B2 | 10/2016 | Guo | |
| 9,595,221 B2 | 3/2017 | Hamer | |
| 9,645,436 B2 | 5/2017 | Chen | |
| 9,653,041 B2 * | 5/2017 | Nakanishi | G09G 3/2074 |
| 9,953,590 B2 | 4/2018 | Ben-David | |
| 2002/0070909 A1 | 6/2002 | Asano | |
| 2004/0174389 A1 | 9/2004 | Ben-David | |
| 2004/0263528 A1 | 12/2004 | Murdoch | |
| 2005/0122294 A1 | 6/2005 | Ben-David | |
| 2006/0098033 A1 | 5/2006 | Langendijk | |
| 2006/0170712 A1 * | 8/2006 | Miller | H01L 27/3218 345/695 |
| 2007/0195229 A1 | 8/2007 | Kuribayashi | |
| 2009/0121992 A1 | 5/2009 | Asao | |
| 2010/0289727 A1 | 11/2010 | Miller | |
| 2011/0128309 A1 | 6/2011 | Miyazaki | |
| 2012/0212515 A1 | 8/2012 | Hamer | |
| 2013/0249377 A1 | 9/2013 | Hamer | |
| 2015/0362795 A1 | 12/2015 | Chen | |
| 2016/0019823 A1 | 1/2016 | Guo et al. | |
| 2016/0027369 A1 | 1/2016 | Guo et al. | |
| 2016/0027405 A1 | 1/2016 | Nakanishi | |
| 2016/0247444 A1 | 8/2016 | Hamer | |
| 2016/0293084 A1 | 10/2016 | Guo et al. | |
| 2016/0329026 A1 | 11/2016 | Lu et al. | |
| 2016/0379533 A1 | 12/2016 | Guo | |
| 2017/0004756 A1 | 1/2017 | Guo et al. | |

FOREIGN PATENT DOCUMENTS

| | | |
|---|---|---|
| CN | 104299561 | 1/2015 |
| CN | 104680948 | 6/2015 |
| CN | 104933980 | 9/2015 |
| CN | 106023818 | 10/2016 |
| JP | 4969194 | 7/2012 |

OTHER PUBLICATIONS

Search Report from International Application No. PCT/CN2017/073562 dated May 8, 2017.

* cited by examiner

PIXEL STRUCTURE, DISPLAY PANEL AND DRIVING METHOD OF PIXEL STRUCTURE

RELATED APPLICATION

This application is a continuation of U.S. patent application Ser. No. 15/560,572, filed on Sep. 22, 2017, which is the U.S. national phase entry of PCT/CN2017/073562 with an international filing date of Feb. 15, 2017, which claims priority to Chinese Application No. 201610330686.X, filed on May 18, 2016, the entire disclosures of which are hereby incorporated be reference.

TECHNICAL FIELD

The present application relates to the field of computer technology, particularly to a pixel structure, a display panel and a driving method of the pixel structure.

BACKGROUND

In the related technology, the sub-pixels of a display screen are mainly arranged in two ways, i.e., normal sub-pixel arrangement and delta pixel arrangement.

The normal sub-pixel arrangement is a typical RGB stripe arrangement, as shown in FIG. 1. Such an arrangement controls the brightness and the chroma displayed by the pixel by controlling the corresponding color components of red (R), green (G) and blue (B) of each sub-pixel. Hence, the brightness of the pixel is generally determined by an average value of the brightness of each sub-pixel. However, the brightness of the pixel is generally not high, and such a stripe arrangement has a large power consumption and a low color gamut, which does not conform to the requirement of high color gamut, low power consumption and low cost. FIG. 2 is a schematic view of the delta pixel arrangement. The sub-pixel in the delta pixel arrangement includes three colors of RGB, and the odd rows and the even rows are staggered so as to form a " 品 " shaped arrangement. However, such an arrangement has a low color gamut.

SUMMARY

The present application provides a pixel structure, a display panel and a driving method of the pixel structure, for solving the problem of low color gamut in the prior art.

According to an aspect of the present application, a pixel structure is provided, comprising: a plurality of sub-pixel groups arranged in an array. Each of the sub-pixel groups is constituted by 6 sub-pixels of different colors arranged in two rows and three columns respectively. In each row of the sub-pixels, a square pixel unit is constituted by at most two adjacent sub-pixels, such that each square pixel unit only requires two data transmission lines.

In a possible implementation, in the above pixel structure, color arrangement orders of sub-pixels in two adjacent sub-pixel groups in a column direction are the same. Color arrangement orders of sub-pixels in two adjacent sub-pixel groups in a row direction are the same.

In a possible implementation, in the above pixel structure, color arrangement orders of sub-pixels in two adjacent sub-pixel groups in a column direction are the same. A color arrangement order of an odd row of sub-pixels in a sub-pixel group in the row direction is the same as a color arrangement order of an even row of sub-pixels in an adjacent sub-pixel group.

In a possible implementation, in the above pixel structure, two adjacent rows of sub-pixels are staggered in a column direction.

In a possible implementation, in the above pixel structure, in each row of sub-pixels, a square pixel unit is constituted by every 2 sub-pixels, a ratio of a length of the sub-pixel along the row direction and a length of the sub-pixel along the column direction is 1:2.

In a possible implementation, in the above pixel structure, a square pixel unit is constituted by every 1.5 sub-pixels, a ratio of a length of the sub-pixel along the row direction and a length of the sub-pixel along the column direction is 1:1.5.

In a possible implementation, in the above pixel structure, a square pixel unit is constituted by every 1 sub-pixel, a ratio of a length of the sub-pixel along the row direction and a length of the sub-pixel along the column direction is 1:1.

In a possible implementation, in the above pixel structure, the pixel structure comprises sub-pixels of red, blue, green, cyan, magenta and yellow.

According to another aspect of the present application, a display panel is further provided, comprising the above pixel structure.

According to another aspect of the present application, a method of driving the above pixel structure is provided, comprising:

receiving original image information of a frame to be displayed;

determining a corresponding sampling area of each sub-pixel in the pixel structure based on the color arrangement order of the sub-pixels in each sub-pixel group in the pixel structure; the corresponding sampling area of each sub-pixel comprising a square pixel unit constituted by the sub-pixel and at least partial adjacent square pixel unit;

determining a weight of each square pixel unit comprised in the sampling area in the corresponding sampling area of each sub-pixel based on a proportion of area occupied by the square pixel unit comprised in the determined corresponding sampling area of each sub-pixel in the sampling area;

determining a gray scale value that needs to be displayed by each sub-pixel based on the weight of each square pixel unit comprised in the sampling area in the corresponding sampling area of each sub-pixel and a corresponding gray scale value of each square pixel unit with a same color as the sub-pixel in the original image information of the frame to be displayed;

performing display based on the determined gray scale value that needs to be displayed by each sub-pixel.

In a possible implementation, in the above method, the step of determining a corresponding sampling area of each sub-pixel in the pixel structure based on the color arrangement order of the sub-pixels in each sub-pixel group in the pixel structure specifically comprises:

when the color arrangement orders of sub-pixels in two adjacent sub-pixel groups in the row direction are the same, the corresponding sampling area of each sub-pixel in the pixel structure being: a rectangular sampling area that takes the sub-pixel as the center and overlaps with 9 square pixel units arranged in three rows and three columns respectively; and corresponding sampling areas of sub-pixels of the same color being in continuous distribution.

In a possible implementation, in the above method, the step of determining a corresponding sampling area of each sub-pixel in the pixel structure based on the color arrangement order of the sub-pixels in each sub-pixel group in the pixel structure specifically comprises:

when the color arrangement orders of sub-pixels in two adjacent sub-pixel groups in the row direction are the same, the corresponding sampling area of a sub-pixel of three primary colors in the pixel structure being: a rectangular sampling area that takes the sub-pixel as the center and overlaps with 9 square pixel units arranged in three rows and three columns respectively; and corresponding sampling areas of sub-pixels of the same primary color being in continuous distribution;

when the color arrangement orders of sub-pixels in two adjacent sub-pixel groups in the row direction are the same, the corresponding sampling area of a sub-pixel of three mixed colors in the pixel structure being: a square pixel unit constituted by the sub-pixel and a square pixel unit adjacent in the row direction; and corresponding sampling areas of sub-pixels of the same mixed color being in continuous distribution in the row direction.

In a possible implementation, in the above method, the step of determining a corresponding sampling area of each sub-pixel in the pixel structure based on the color arrangement order of the sub-pixels in each sub-pixel group in the pixel structure specifically comprises:

when a color arrangement order of an odd row of sub-pixels in a sub-pixel group in the row direction is the same as a color arrangement order of an even row of sub-pixels in an adjacent sub-pixel group, the corresponding sampling area of each sub-pixel in the pixel structure being: a rectangular sampling area that takes the sub-pixel as the center and overlaps with 15 square pixel units arranged in three rows and five columns respectively; and corresponding sample areas of odd rows of sub-pixels of the same color being in continuous distribution, corresponding sampling areas of even rows of sub-pixels of the same color being in continuous distribution.

In a possible implementation, in the above method, the step of determining a corresponding sampling area of each sub-pixel in the pixel structure based on the color arrangement order of the sub-pixels in each sub-pixel group in the pixel structure specifically comprises:

when a color arrangement order of an odd row of sub-pixels in a sub-pixel group in the row direction is the same as a color arrangement order of an even row of sub-pixels in an adjacent sub-pixel group, the corresponding sampling area of a sub-pixel of three primary colors in the pixel structure being: a rectangular sampling area that takes the sub-pixel as the center and overlaps with 15 square pixel units arranged in three rows and five columns respectively; and corresponding sample areas of odd rows of sub-pixels of the same color being in continuous distribution, corresponding sampling areas of even rows of sub-pixels of the same color being in continuous distribution;

when a color arrangement order of an odd row of sub-pixels in a sub-pixel group in the row direction is the same as a color arrangement order of an even row of sub-pixels in an adjacent sub-pixel group, the corresponding sampling area of a sub-pixel of three mixed colors in the pixel structure being: a square pixel unit constituted by the sub-pixel and a square pixel unit adjacent in the row direction; and corresponding sampling areas of sub-pixels of the same mixed color being in continuous distribution in the row direction.

The pixel structure provided by an embodiment of the present application comprises a plurality of sub-pixel groups arranged in an array, wherein each sub-pixel group is constituted by 6 sub-pixels of different colors arranged in two rows and three columns respectively; in each row of sub-pixels, a square pixel unit being constituted by at most two adjacent sub-pixels. In the pixel structure provided by the embodiment of the present application, each sub-pixel group is constituted by 6 sub-pixels of different colors, so as to increase the color gamut of the pixel structure, and in each row of sub-pixels, a square pixel unit being constituted by at most two adjacent sub-pixels, so as to reduce the number of the data transmission lines required by the pixel structure.

BRIEF DESCRIPTION OF THE DRAWINGS

FIG. 1 is a schematic view of a typical RGB stripe pixel structure in the prior art;

FIG. 2 is a schematic view of a delta pixel structure in the prior art;

DETAILED DESCRIPTION

With respect to the problem of low color gamut of the pixel structure in the prior art, embodiments of the present application provide a pixel structure, a display panel and a driving method of the pixel structure. Next, the specific implementation of the pixel structure provided by an embodiment of the present application will be explained in detail with reference to the drawings.

Figure 3:
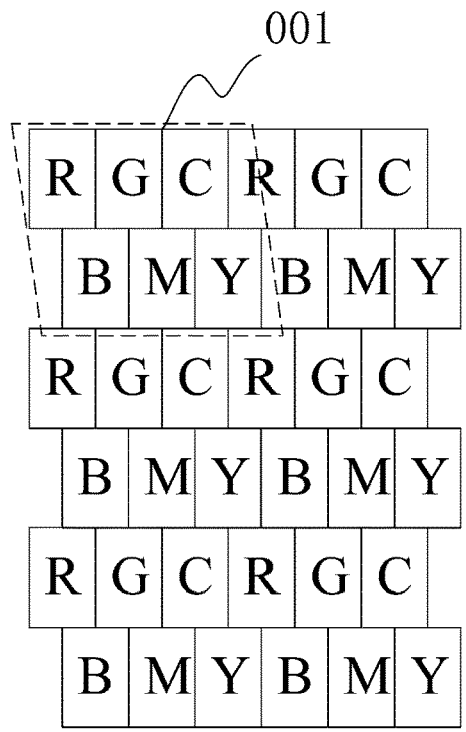
FIG. 3 is a schematic view of a pixel structure provided according to an embodiment of the present application.
Figure 4:
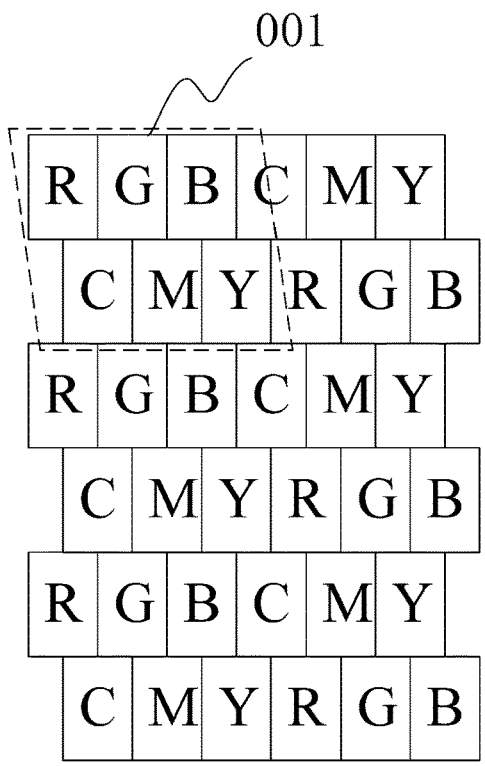
FIG. 4 is a schematic view of a pixel structure provided according to an embodiment of the present application.

As shown in FIG. 3 or FIG. 4, the pixel structure according to an embodiment of the present application comprises: a plurality of sub-pixel groups 001 arranged in an array. Each sub-pixel group 001 is constituted by 6 sub-pixels of different colors arranged in two rows and three columns respectively. In each row of sub-pixels, a square pixel unit is constituted by at most two adjacent sub-pixels.

In the pixel structure provided by an embodiment of the present application, each sub-pixel group 001 is constituted by 6 sub-pixels of different colors, so as to increase the color gamut of the pixel structure. Moreover, in each row of sub-pixels, a square pixel unit is constituted by at most two adjacent sub-pixels so as to reduce the number of data transmission lines required by the pixel structure.

Figures 1, 2:
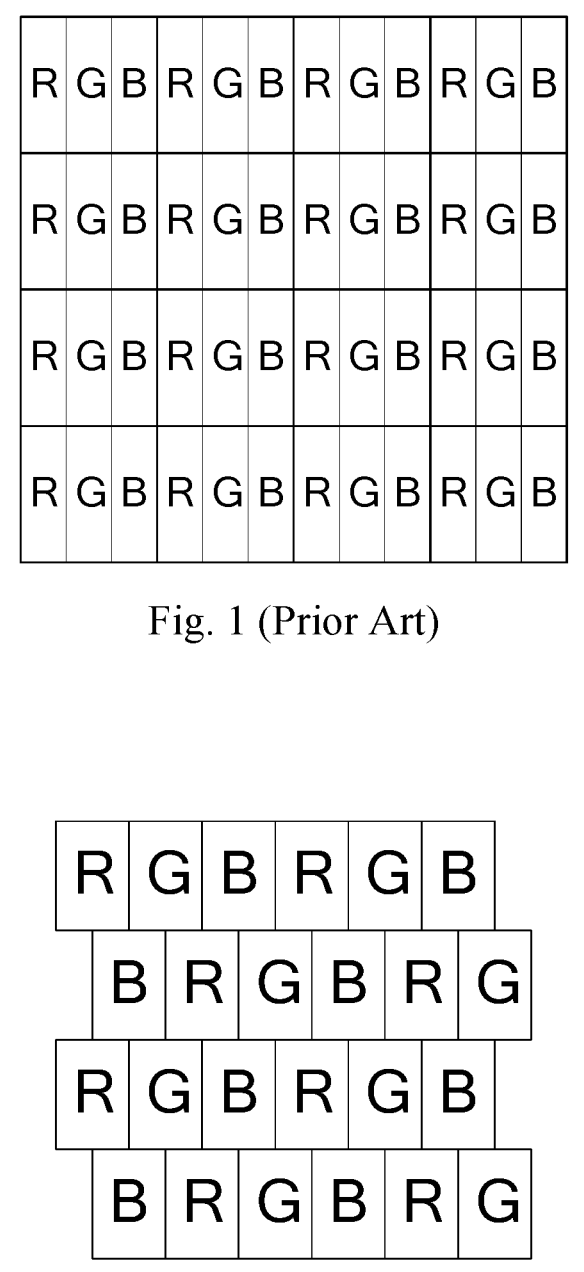

In FIG. 3 and FIG. 4, the 6 sub-pixels within the dotted line of the parallelogram constitute a sub-pixel group 001, and each sub-pixel group 001 is constituted by 6 sub-pixels of different colors arranged in two rows and three columns. The shape of the sub-pixel in each sub-pixel group 001 is preferably rectangle, and the size of each sub-pixel is the same. In specific implementation, the sub-pixel can be set in other shapes, and the size of the sub-pixel can also be adjusted based on actual conditions, hence, the shape and the size of the sub-pixel will not be defined here. FIG. 3 and FIG. 4 take the example of the arrangement manner that the odd rows and the even rows are staggered by a certain width. In actual applications, the odd rows and the even rows can also be aligned. FIG. 3 and FIG. 4 only schematically draw a pixel structure of 6 rows and 6 columns. In actual application, more sub-pixel groups 001 can be arranged according to the pixel arrangement rule of the embodiment of the present application based on actual needs. In each row of sub-pixels, a square pixel unit is constituted by at most two adjacent sub-pixels. In FIG. 1, each square pixel unit comprises three sub-pixels and requires three data transmission lines, while in FIG. 3 or FIG. 4, if two adjacent sub-pixels constitute a square pixel unit, each square pixel unit only requires two data transmission lines, thereby reducing the number of the data transmission lines.

In the pixel structure provided by an embodiment of the present application, the color arrangement orders of the sub-pixels in two adjacent sub-pixels in the column direction are the same.

The color arrangement orders of sub-pixels in two adjacent sub-pixel groups 001 in the row direction are the same. As shown in FIG. 3, alternatively, a color arrangement order of an odd row of sub-pixels in a sub-pixel group 001 in the row direction is the same as a color arrangement order of an even row of sub-pixels in an adjacent sub-pixel group 001, as shown in FIG. 4.

In the pixel structure as shown in FIG. 3, the sub-pixels of three colors are arranged cyclically in the odd row, the sub-pixels of other three colors are arranged cyclically in the even row. FIG. 3 takes the example that red (R), green (G) and cyan (C) are arranged cyclically in the odd rows, and blue (B), magenta (M) and yellow (Y) are arranged cyclically in the even rows. In specific implementation, other color orders can also be used for the arrangement. For example, the three colors of RGB are arranged cyclically in the odd rows, and the three colors of CMY are arranged cyclically in the even rows. Moreover, the three colors of RGC can be arranged in various orders such as RGC, RCG, CGR, GCR etc., or other colors can also be used. The colors of the sub-pixels and the color arrangement orders of the sub-pixels in the odd rows and even rows will not be defined here.

In the pixel structure as shown in FIG. 4, sub-pixels of six colors are arranged cyclically in each row. FIG. 4 takes the example of the arrangement order of six colors of RGBCMY. In specific implementation, other colors and other color orders can also be used for the arrangement, for example, various color arrangement orders of RBCYGM, GRBCMY, BGRCMY. The colors of the sub-pixels and the color arrangement orders will not be defined here. The arrangement of the sub-pixel structure as shown in FIG. 4 is more uniform in the row direction.

In the pixel structure provided by an embodiment of the present application, two adjacent rows of sub-pixels are staggered by X sub-pixels in the column direction, $0 \leq X \leq 1$. When X is equal to 0, the pixel structure is in a stripe arrangement, when X is equal to 1, two adjacent rows of sub-pixels are staggered by one sub-pixel in the column direction.

In an embodiment, in each row of sub-pixels, a square pixel unit is constituted by every 2 sub-pixels, a ratio of a length of the sub-pixel along the row direction and a length of the sub-pixel along the column direction is 1:2.

In an embodiment, a square pixel unit is constituted by every 1.5 sub-pixels, a ratio of a length of the sub-pixel along the row direction and a length of the sub-pixel along the column direction is 1:1.5.

In an embodiment, a square pixel unit is constituted by every 1 sub-pixel, a ratio of a length of the sub-pixel along the row direction and a length of the sub-pixel along the column direction is 1:1.

In each row of sub-pixels, a square pixel unit is constituted by every 2 sub-pixels, thus each square pixel unit only requires two data transmission lines. Compared to the typical stripe arrangement which requires three data transmission lines, the number of the data transmission lines is reduced. In each row of sub-pixels, a square pixel unit is constituted by every 1.5 or 1 sub-pixel, compared to the typical stripe arrangement, the number of the data transmission lines is further reduced. In the embodiments of the present application, the illustration is made only by taking the example that every 2, 1.5 or 1 sub-pixel constitutes a square pixel unit, however, in actual applications, a square pixel unit can also be constituted by other number of sub-pixels less than 2, which can also reduce the number of the data transmission lines.

The pixel structure provided by an embodiment of the present application can comprise sub-pixels of red, blue, green, cyan, magenta and yellow. However, in actual applications, sub-pixels of other colors can also be used, which will not be defined here.

The pixel structure provided by an embodiment of the present invention can be applied in a liquid crystal display (LCD) or an organic light emitting diode (OLED), and can also be applied in other display panels or display devices, which will not be defined here.

Based on the same inventive concept, an embodiment of the present application provides a display panel, comprising the above pixel structure.

Figure 5:
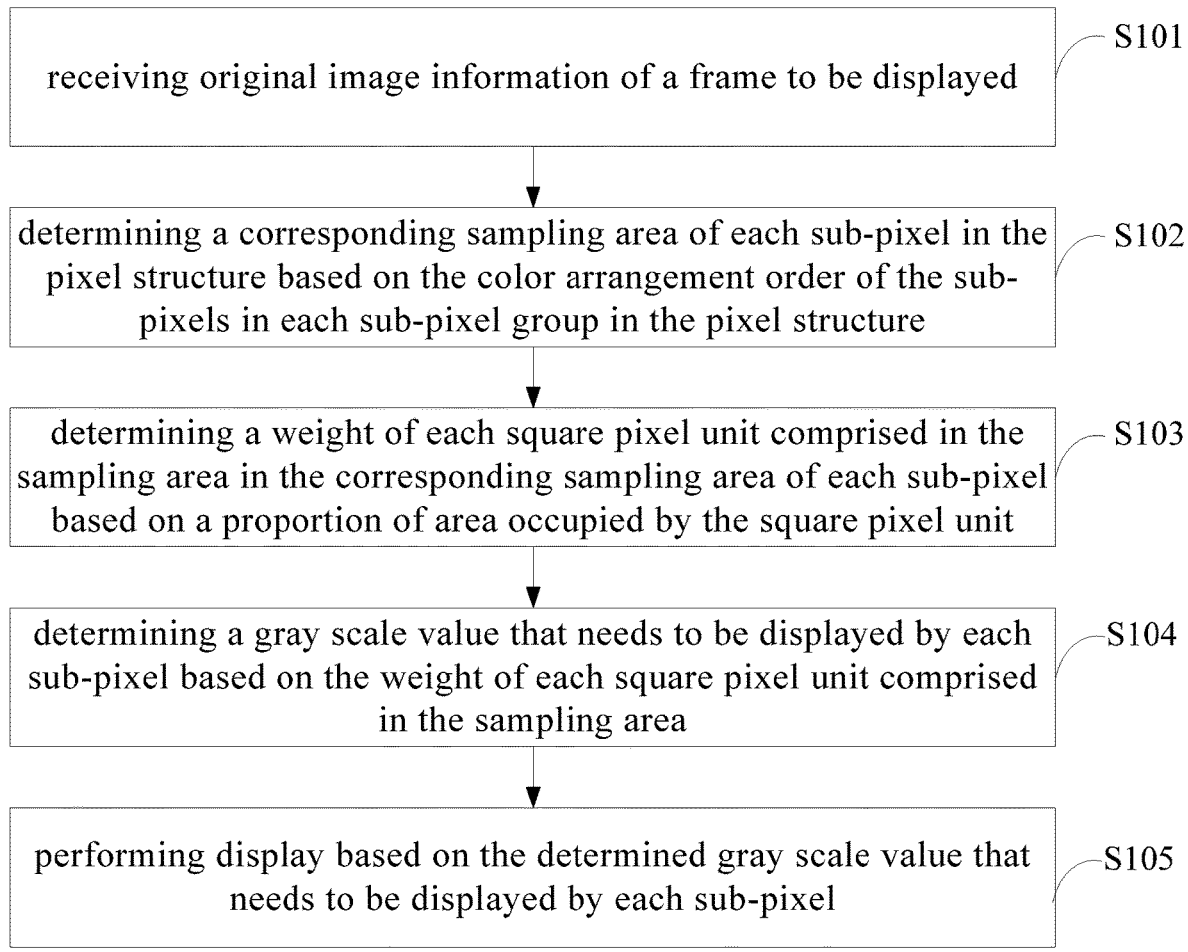
FIG. 5 is a flow chart of a method of driving a pixel structure provided according to an embodiment of the present application.

Based on the same inventive concept, an embodiment of the present application provides a method for driving the above pixel structure, the flow chart is as shown in FIG. 5, comprising:

S101, receiving original image information of a frame to be displayed;

S102, determining a corresponding sampling area of each sub-pixel in the pixel structure based on the color arrangement order of the sub-pixels in each sub-pixel group in the pixel structure; the corresponding sampling area of each sub-pixel comprising a square pixel unit constituted by the sub-pixel and at least partial adjacent square pixel unit;

S103, determining a weight of each square pixel unit comprised in the sampling area in the corresponding sampling area of each sub-pixel based on a proportion of area occupied by the square pixel unit comprised in the determined corresponding sampling area of each sub-pixel in the sampling area;

S104, determining a gray scale value that needs to be displayed by each sub-pixel based on the weight of each square pixel unit comprised in the sampling area in the corresponding sampling area of each sub-pixel and a corresponding gray scale value of each square pixel unit with a same color as the sub-pixel in the original image information of the frame to be displayed;

S105, performing display based on the determined gray scale value that needs to be displayed by each sub-pixel.

The method for driving the pixel structure provided by an embodiment of the present application performs sub-pixel rendering to the inputted original image information, uses a lower actual physical pixel to realize a higher visual resolution, thereby achieving a better display effect, and improving visual resolution of the human eyes and the user experience.

Next, the driving method provided by an embodiment of the present application will be described in detail with reference to the pixel structure as shown in FIG. 3. FIG. 3 makes explanation by taking the example that the sub-pixel is a rectangle, and the ratio of the length of the sub-pixel along the row direction and the length of the sub-pixel along the column direction is 1:1.5, i.e., 1.5 sub-pixels constitute a square pixel unit.

Figure 6:
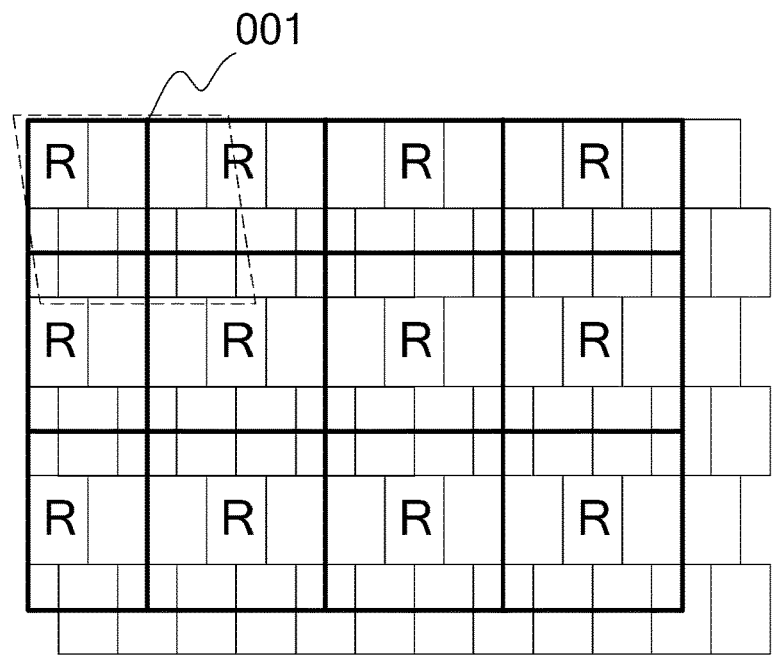
FIG. 6 is a schematic view of a sampling area of a red sub-pixel in the pixel structure as shown in FIG. 3 provided according to an embodiment of the present application.

Take the example of a red sub-pixel, the step S102 provided by an embodiment of the present application can be performed in the following way:

The corresponding sampling area of the red sub-pixel in the pixel structure is determined based on the arrangement order of the red sub-pixel in the pixel structure. As shown in FIG. 6, in the multiple block areas formed by heavy lines, each block is a sampling area, each sampling area comprises a square pixel unit constituted by one red sub-pixel and at least partial adjacent square pixel unit. In order to demonstrate the sampling area of the red sub-pixel more clearly, sub-pixels of other colors are not shown in FIG. 6. The pixel structure as shown in FIG. 6 and the pixel structure as shown in FIG. 3 have the same color arrangement order, there are also sub-pixels of other colors around the red sub-pixels actually.

Figure 7:
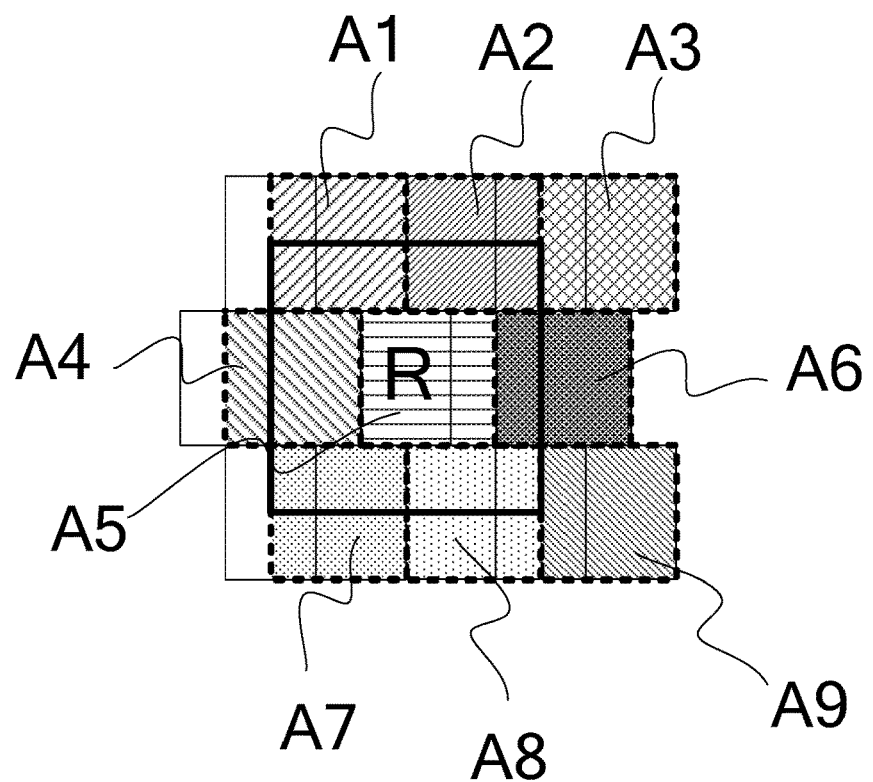
FIG. 7 is a schematic view of a pixel unit comprised in a sampling area of a red sub-pixel in the pixel structure as shown in FIG. 3 provided according to an embodiment of the present application.

Specifically, the sampling area of the red sub-pixel can be determined in the following way:

The sampling area of the red sub-pixel is: a rectangular sampling area that takes a red sub-pixel as the center and overlaps with 9 square pixel units arranged in three rows and three columns; and the corresponding sampling areas of sub-pixels of the same color are in continuous distribution, as shown in FIG. 6. FIG. 7 explains the 9 square pixel units corresponding to the sampling area of the red sub-pixel by taking any one of the red sub-pixels in FIG. 6 as the example. The 9 blocks A1-A9 that are filled and have dotted frames in the figure represent the positions of the 9 pixel units.

Also by taking the red sub-pixel as an example, the step S103 provided by an embodiment of the present application can be performed in the following way:

Referring to FIG. 7, in order to demonstrate the sampling area of the red sub-pixel more clearly, sub-pixels of other colors are not shown in FIG. 7. The weight of each square pixel unit is determined based on a proportion of area occupied by the pixel units A1-A9 in the sampling area. The obtained weight of the pixel unit comprised in the sampling area of the red sub-pixel is:

$$\text{Filter\_R} = \begin{bmatrix} 3 & 3 & 0 \\ 4 & 6 & 2 \\ 3 & 3 & 0 \end{bmatrix}$$

Also take the example of a red sub-pixel, the step S104 provided by an embodiment of the present application can be performed in the following way:

A gray scale value R that needs to be displayed by the red sub-pixel is determined based on the weight of the 9 square pixel units in the corresponding sampling area of the red sub-pixel and a gray scale value r of the corresponding red sub-pixel of each square pixel unit in the original image information of a frame to be displayed.

The gray scale value R (m, n) of the nth red sub-pixel in the mth row in the pixel structure provided by an embodiment of the present application is calculated in the following way:

$$R(m, n) = \text{Filter\_R} * \begin{bmatrix} r(m-1, 2n-2) & r(m-1, 2n-1) & r(m-1, 2n) \\ r(m, 2n-2) & r(m, 2n-1) & r(m, 2n) \\ r(m+1, 2n-2) & r(m+1, 2n-1) & r(m+1, 2n) \end{bmatrix}$$

Wherein r(m,n) represents the gray scale value of the red sub-pixel in the nth pixel of the mth row in the original image information; filter_R represents the weight of the 9 square pixel units in the corresponding sampling area of the red sub-pixel.

As for sub-pixels of other colors, the similar way as the red sub-pixel can be used to set the sampling area, to determine the weight of each pixel unit comprised in the sampling area and to determine the gray scale value that the color needs to display, and finally to perform display based on the determined gray scale value that each sub-pixel needs to display.

When driving the pixel structure as shown in FIG. 3, the three primary colors (i.e., red, green and blue) and three mixed colors (i.e., cyan, magenta and yellow) can be driven by different driving ways.

The corresponding sampling area of each sub-pixel of three primary colors in the pixel structure is: a rectangular sampling area that takes the sub-pixel as the center and overlaps with 9 square pixel units arranged in three rows and three columns respectively; and the corresponding sampling areas of sub-pixels of the same primary color are in continuous distribution.

The setting of the sampling area of sub-pixels of three primary colors is the same as the setting of the sampling area of the red sub-pixel in the above embodiment. The weight of the pixel unit comprised in the sampling areas of the green sub-pixel and the blue sub-pixel differs from the weight of the pixel unit comprised in the red sub-pixel, wherein the weight of the corresponding 9 pixel units in the sampling area of the green sub-pixel is:

$$\text{Filter\_G} = \begin{bmatrix} 1 & 3 & 2 \\ 0 & 6 & 6 \\ 1 & 3 & 2 \end{bmatrix};$$

The weight of the corresponding 9 pixel units of the sampling area of the blue sub-pixel is:

$$\text{Filter\_B} = \begin{bmatrix} 1 & 3 & 2 \\ 4 & 6 & 2 \\ 1 & 3 & 2 \end{bmatrix}.$$

Figure 8:
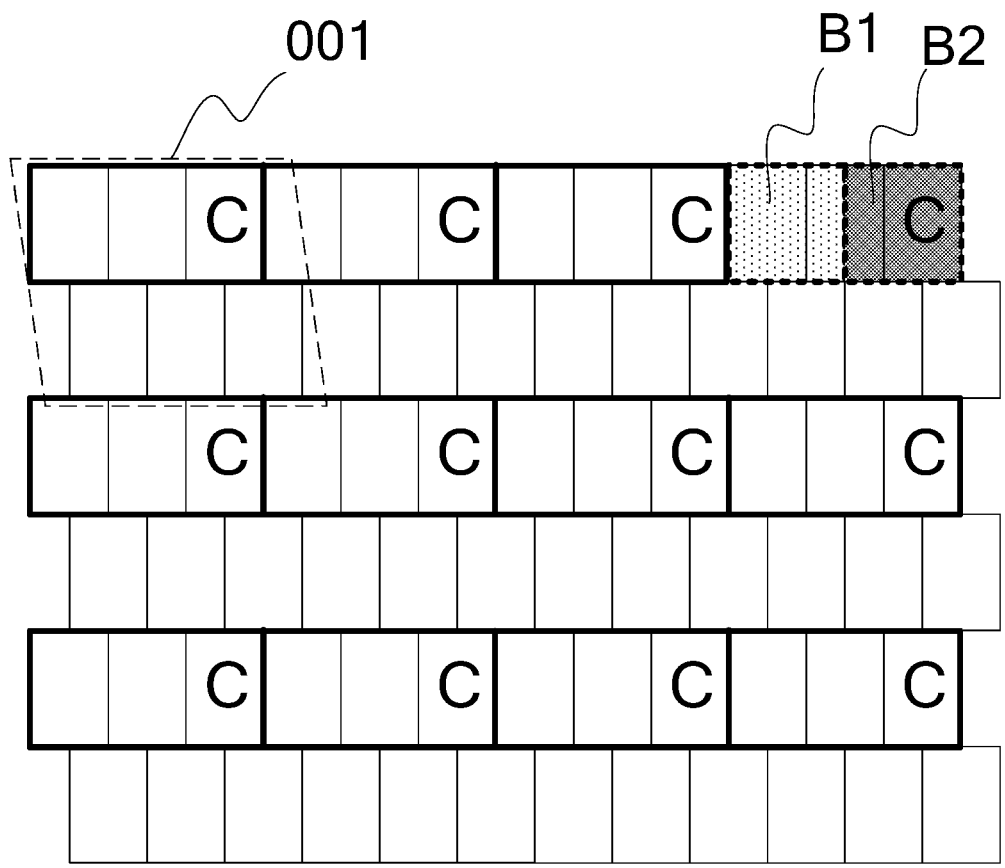
FIG. 8 is a schematic view of a sampling area of a cyan sub-pixel in the pixel structure as shown in FIG. 3 provided according to an embodiment of the present application.

The corresponding sampling area of each sub-pixel of three mixed colors in the pixel structure is: a square pixel unit constituted by the sub-pixel and a square pixel unit adjacent in the row direction; and the corresponding sampling areas of sub-pixels of the same mixed color are in continuous distribution in the row direction, as shown in FIG. 8.

Next, the driving method of sub-pixels of each mixed color will be explained by taking the cyan sub-pixel as the example. In order to demonstrate the sampling area of the cyan sub-pixel more clearly, sub-pixels of other colors are not shown in FIG. 8.

The sampling area of the cyan sub-pixel comprises a square pixel unit constituted by a cyan sub-pixel and a square pixel unit adjacent in the row direction. The two blocks B1 and B2 in FIG. 8 that are filled and have dotted frames represent two pixel units comprised in the sampling area. FIG. 8 explains the pixel units comprised in this sampling area by taking the 4 cyan sub-pixels in the first row as the example. In order to achieve a more demonstration effect, the heavy line frames of this sampling area are omitted in the figure.

In FIG. 8, one sampling area comprises a square pixel unit constituted by a cyan sub-pixel and a pixel unit at the left of this pixel unit. In actual applications, one sampling area can also comprise a square pixel unit constituted by a cyan sub-pixel and a pixel unit at the right of this pixel unit, or, a pixel unit comprises a cyan sub-pixel and a sub-pixel of other colors at the left and right side thereof respectively.

From FIG. 8 it can be seen that the two square pixel units B1 and B2 comprised in the sampling area of the cyan sub-pixel have the same area, also because the cyan is composed of blue and green of the same content, the weight of the pixel unit comprised in the cyan sampling area is:

$$\text{Filter\_C} = \begin{bmatrix} 1 & 1 \\ 1 & 1 \end{bmatrix},$$

The gray scale value C (m, n) of the nth cyan sub-pixel in the mth row in the pixel structure provided by an embodiment of the present application is calculated in the following way:

$$C(m, n) = \text{Filter\_C} * \begin{bmatrix} g(m, 2n-1) & g(m, 2n) \\ b(m, 2n-1) & b(m, 2n) \end{bmatrix}$$

Wherein g(m, n) represents the gray scale value of the green sub-pixel in the nth pixel of the mth row in the original image information; b (m, n) represents the gray scale value of the blue sub-pixel in the nth pixel of the mth row in the original image information; Filter_C represents the weight of the 9 square pixel units in the corresponding sampling area of the cyan sub-pixel.

The setting of the sampling areas of the magenta sub-pixel and the yellow sub-pixel is the same as that of the sampling area of the cyan sub-pixel, and the weight of the pixel unit comprised in the sampling areas of the magenta sub-pixel and the yellow sub-pixel is the same as the weight of the pixel unit comprised in the cyan sub-pixel, i.e., the weight of the pixel unit comprised in the sampling area of the magenta sub-pixel is:

$$\text{Filter\_M} = \begin{bmatrix} 1 & 1 \\ 1 & 1 \end{bmatrix};$$

The weight of the pixel unit comprised in the sampling area of the yellow sub-pixel is:

$$\text{Filter\_Y} = \begin{bmatrix} 1 & 1 \\ 1 & 1 \end{bmatrix}.$$

The setting of the sampling area of the three mixed colors is different from the sampling area of the three primary colors. The sampling area of the three mixed colors comprises less pixel units than the sampling area of the three primary colors, thus repeated sampling is avoided and such a sampling can be carried out more easily.

Next, the driving method provided by an embodiment of the present invention will be described in detail with reference to the pixel structure provided by FIG. 4 of the present invention. FIG. 4 makes explanation by taking the example that the sub-pixel is a rectangle and the ratio of the length of each sub-pixel along the row direction and the length of the sub-pixel along the column direction is 1:1.5, i.e., 1.5 sub-pixels constituting a square pixel unit.

Figure 9:
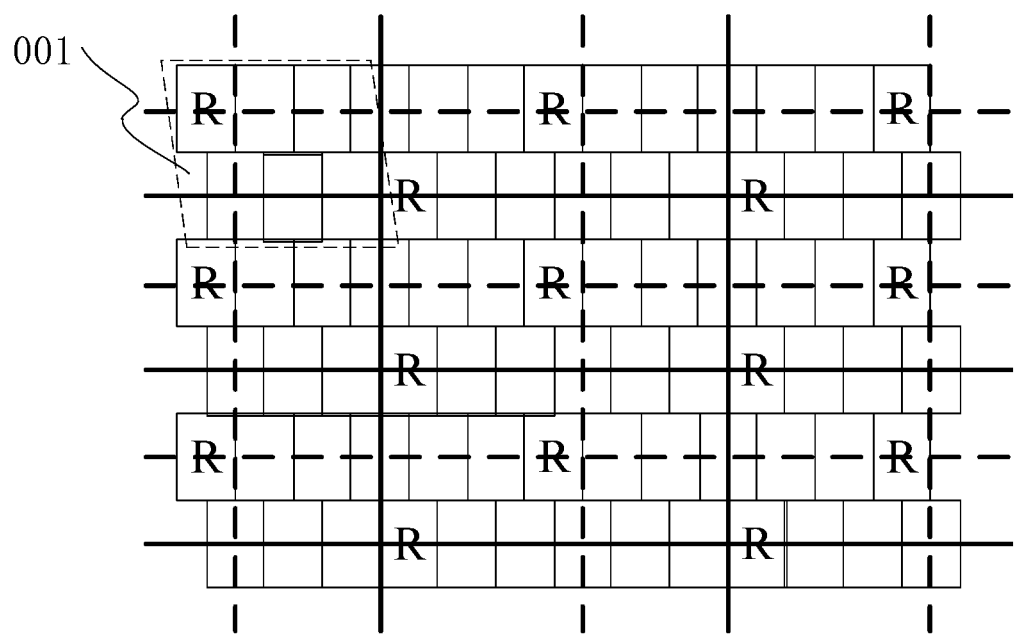
FIG. 9 is a schematic view of a sampling area of a red sub-pixel in the pixel structure as shown in FIG. 4 provided according to an embodiment of the present application.

Takes the red sub-pixel as an example, as shown in FIG. 9, in order to demonstrate the sampling area of the red sub-pixel more clearly, sub-pixels of other colors are not shown in FIG. 9. Because the red sub-pixels exist in both odd rows and even rows, sampling areas have to be set to the red sub-pixels in odd rows and even rows respectively, in this way, the driving effect will be better. Specifically, the sampling area of the red sub-pixel is: a rectangular sampling area that takes a red sub-pixel as the center and overlaps with 15 square pixel units arranged in three rows and five columns respectively; and the corresponding sampling areas of odd rows of sub-pixels of the same color are in continuous distribution, the corresponding areas of even rows of sub-pixels of the same color are in continuous distribution. In FIG. 9, the block areas formed by heavy lines are corresponding sampling areas of the odd rows of sub-pixels, the block areas formed by heavy dotted lines are corresponding sampling areas of the even rows of sub-pixels. The implementation of determining the weight of the pixel unit comprised in the sampling area of the red sub-pixel in the pixel structure is similar as the implementation of determining the weight of the pixel unit comprised in the sampling area of the red sub-pixel in the pixel structure in the above FIG. 3, which will not be repeated here.

As for sub-pixels of other colors, the similar way as the red sub-pixel can be used to set the sampling area, to determine the weight of each pixel unit comprised in the sampling area and to determine the gray scale value that the color needs to display, and finally to perform display based on the determined gray scale value that each sub-pixel needs to display.

When driving the pixel structure as shown in FIG. 4, the three primary colors (i.e., red, green and blue) and three mixed colors (i.e., cyan, magenta and yellow) can be driven by different driving ways.

The corresponding sampling area of each sub-pixel of three primary colors in the pixel structure is: a rectangular sampling area that takes the sub-pixel as the center and overlaps with 15 square pixel units arranged in three rows and five columns respectively; and the corresponding sampling areas of odd rows of sub-pixels of the same color are in continuous distribution, the corresponding sampling areas of even rows of sub-pixels of the same color are in continuous distribution. The setting of the sampling area of each sub-pixel of the three primary colors is the same as the setting of the sampling area of the red sub-pixel in the above implementation.

Figure 10:
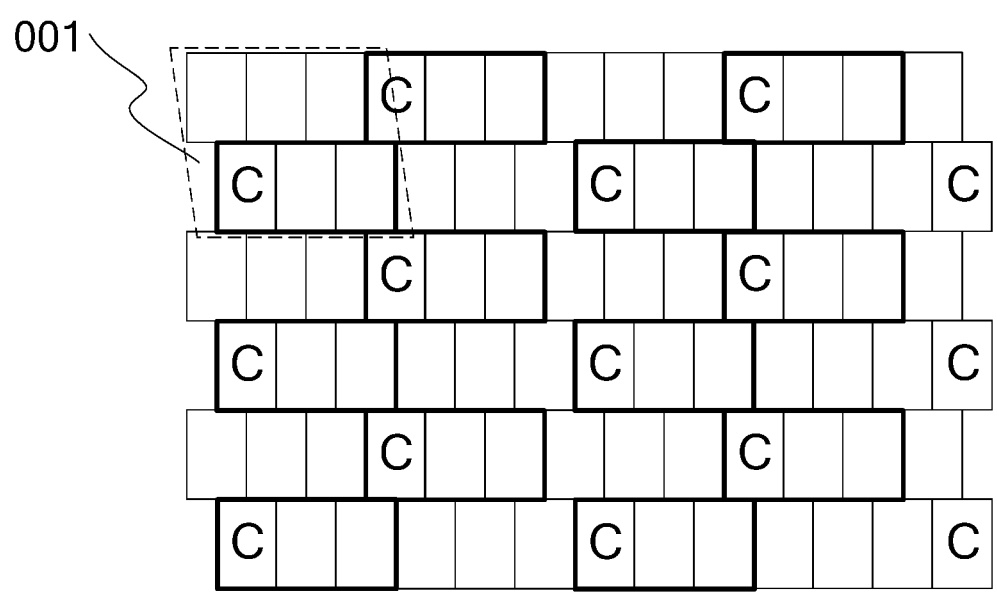
FIG. 10 is a sampling area of a cyan sub-pixel in the pixel structure as shown in FIG. 4 provided according to an embodiment of the present application

The corresponding sampling area of each sub-pixel of three mixed colors in the pixel structure is: a square pixel unit constituted by the sub-pixel and a square pixel unit adjacent in the row direction; and the corresponding sampling areas of sub-pixels of the same mixed color are in continuous distribution in the row direction. As shown in FIG. 10, FIG. 10 takes the sampling area of the cyan sub-pixel as an example, and in order to demonstrate the sampling area of the cyan sub-pixel more clearly, sub-pixels of other colors are not shown in FIG. 10. The sampling area of the cyan sub-pixel comprises a square pixel unit constituted by a cyan sub-pixel and a square pixel unit adjacent in the row direction. In FIG. 10, a sampling area comprises a square pixel unit constituted by a cyan sub-pixel and a pixel unit at the right of the pixel unit. In actual applications, a sampling area can also comprises a square pixel unit constituted by a cyan sub-pixel and a pixel unit at the left of the pixel unit, or a pixel unit comprises a cyan sub-pixel and a sub-pixel of other colors at the left and right side thereof respectively. The sampling areas of the magenta sub-pixel and the yellow sub-pixel are similar as the sampling area of the cyan sub-pixel, which will not be repeated here.

Specifically, the same pixel arrangement can comprise multiple ways of determining the sampling area, the weight of the pixel unit comprised by each sampling area will also be different, thus different display effects may occur. In actual applications, multiple ways of determining the sampling area can be compared, so as to make improvement to the driving method of the pixel structure, thereby achieving a better display effect.

Embodiments of the present application provide a pixel structure, a display panel and a driving method of the pixel structure. Each sub-pixel is constituted by 6 sub-pixels of different colors, so as to increase the color gamut of the pixel structure, and in each row of sub-pixels, a square pixel unit being constituted by at most two adjacent sub-pixels, so as to reduce the number of the data transmission lines required by the pixel structure. The method of driving a pixel structure provided by an embodiment of the present application performs sub-pixel rendering to the inputted original image information, uses a lower actual physical pixel to realize a higher visual resolution, thereby achieving a better display effect, and improving visual resolution of the human eyes and the user experience.

Apparently, the skilled person in the art can make various modifications and variations to the present application without departing from the spirit and the scope of the present application. In this way, provided that these modification and variations of the present application belong to the scopes of the Claims of the present application as attached and the equivalent technologies thereof, the present application also intends to encompass these modifications and variations.

What is claimed is:

1. A pixel structure, comprising:
 a plurality of sub-pixel groups arranged in an array, wherein each of the sub-pixel groups is constituted by 6 sub-pixels of different colors arranged in two rows and three columns respectively;
 in each row of the sub-pixels, a square pixel unit being constituted by at most two adjacent sub-pixels,
 wherein each square pixel unit has a corresponding sampling area,
 wherein when a color arrangement order of an odd row of sub-pixels in a sub-pixel group in the row direction is the same as a color arrangement order of an even row of sub-pixels in an adjacent sub-pixel group, the corresponding sampling area of each sub-pixel in the pixel structure is a rectangular sampling area that takes the sub-pixel as the center and overlaps with 15 square pixel units arranged in three rows and five columns respectively; and
 wherein corresponding sampling areas of odd rows of sub-pixels of the same color are in continuous distribution, and corresponding sampling areas of even rows of sub-pixels of the same color are in continuous distribution.

2. The pixel structure as claimed in claim 1, wherein color arrangement orders of sub-pixels in two adjacent sub-pixel groups in a column direction are the same;
 color arrangement orders of sub-pixels in two adjacent sub-pixel groups in a row direction are the same.

3. The pixel structure as claimed in claim 1, wherein color arrangement orders of sub-pixels in two adjacent sub-pixel groups in a column direction are the same;
 a color arrangement order of an odd row of sub-pixels in a sub-pixel group in the row direction is the same as a color arrangement order of an even row of sub-pixels in an adjacent sub-pixel group.

4. The pixel structure as claimed in claim 1, wherein two adjacent rows of sub-pixels are staggered by X sub-pixels in the column direction, $0 \leq X \leq 1$.

5. The pixel structure as claimed in claim 1, wherein in each row of sub-pixels, a square pixel unit is constituted by every 2 sub-pixels, a ratio of a length of the sub-pixel along the row direction and a length of the sub-pixel along the column direction is 1:2.

6. The pixel structure as claimed in claim 1, wherein in each row of sub-pixels, a square pixel unit is constituted by every 1.5 sub-pixels, a ratio of a length of the sub-pixel along the row direction and a length of the sub-pixel along the column direction is 1.1.5.

7. The pixel structure as claimed in claim 1, wherein in each row of sub-pixels, a square pixel unit is constituted by every 1 sub-pixel, a ratio of a length of the sub-pixel along the row direction and a length of the sub-pixel along the column direction is 1:1.

8. The pixel structure as claimed in claim 1, wherein the pixel structure comprises sub-pixels of red, blue, green, cyan, magenta and yellow.

9. A display panel, comprising a pixel structure as claimed in claim 1.

10. The display panel as claimed in claim 9, wherein color arrangement orders of sub-pixels in two adjacent sub-pixel groups in a column direction are the same;
 color arrangement orders of sub-pixels in two adjacent sub-pixel groups in a row direction are the same.

11. The display panel as claimed in claim 9, wherein color arrangement orders of sub-pixels in two adjacent sub-pixel groups in a column direction are the same;
 a color arrangement order of an odd row of sub-pixels in a sub-pixel group in the row direction is the same as a color arrangement order of an even row of sub-pixels in an adjacent sub-pixel group.

12. The display panel as claimed in claim 9, wherein two adjacent rows of sub-pixels are staggered by X sub-pixels in the column direction, $0 \leq X \leq 1$.

13. The display panel as claimed in claim 9, wherein in each row of sub-pixels, a square pixel unit is constituted by every 2 sub-pixels, a ratio of a length of the sub-pixel along the row direction and a length of the sub-pixel along the column direction is 1:2.

14. The display panel as claimed in claim 9, wherein in each row of sub-pixels, a square pixel unit is constituted by every 1.5 sub-pixels, a ratio of a length of the sub-pixel along the row direction and a length of the sub-pixel along the column direction is 1:1.5.

15. The display panel as claimed in claim 9, wherein in each row of sub-pixels, a square pixel unit is constituted by every 1 sub-pixel, a ratio of a length of the sub-pixel along the row direction and a length of the sub-pixel along the column direction is 1:1.

\* \* \* \* \*